United States Patent
Kim et al.

(10) Patent No.: US 8,766,323 B2
(45) Date of Patent: Jul. 1, 2014

(54) ORGANIC LIGHT EMITTING DISPLAY APPARATUS AND METHOD OF MANUFACTURING THE SAME

(75) Inventors: Eun-Ah Kim, Yongin (KR); Tae-Kyu Kim, Yongin (KR); Young-Hee An, Yongin (KR); Jae-Yong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 128 days.

(21) Appl. No.: 13/207,225

(22) Filed: Aug. 10, 2011

(65) Prior Publication Data

US 2012/0080664 A1    Apr. 5, 2012

(30) Foreign Application Priority Data

Oct. 4, 2010   (KR) .................. 10-2010-0096514

(51) Int. Cl.
*H01L 23/52*   (2006.01)

(52) U.S. Cl.
USPC ............ 257/207; 257/691; 257/98; 257/40; 257/E23.153; 438/26; 438/127

(58) Field of Classification Search
None
See application file for complete search history.

(56) References Cited

U.S. PATENT DOCUMENTS

| | | | |
|---|---|---|---|
| 2001/0017409 A1* | 8/2001 | Hiroki et al. | 257/723 |
| 2007/0096633 A1* | 5/2007 | Lee et al. | 313/500 |
| 2011/0051053 A1* | 3/2011 | Okamura et al. | 349/96 |

FOREIGN PATENT DOCUMENTS

| | | |
|---|---|---|
| KR | 0730156 | 6/2007 |
| KR | 20070078502 | 8/2007 |
| KR | 20080090657 | 10/2008 |
| KR | 20080108808 | 12/2008 |

OTHER PUBLICATIONS

Wikipedia, Jan. 2013, "Polyethylene terephthalate" (Wikipedia PET), http://en.wikipedia.org/wiki/Polyethylene_terephthalate.*
Wikipedia, Jan. 2013, "Glass Transistion" (Wikipedia PVC), http://en.wikipedia.org/wiki/Glass_transition.*

* cited by examiner

*Primary Examiner* — Tan N Tran
*Assistant Examiner* — Scott R Wilson
(74) *Attorney, Agent, or Firm* — Knobbe Martens Olson & Bear LLP

(57) ABSTRACT

An organic light emitting display apparatus and method of manufacturing the organic light emitting display apparatus including a lower substrate having power lines in a non-display region that is outside a display region whereon an image is realized; and a functional layer formed between the power lines and an encapsulation substrate.

15 Claims, 7 Drawing Sheets

ORGANIC LIGHT EMITTING DISPLAY APPARATUS AND METHOD OF MANUFACTURING THE SAME

CROSS-REFERENCE TO RELATED APPLICATIONS

This application claims the benefit of Korean Patent Application No. 10-2010-0096514, filed on Oct. 4, 2010, in the Korean Intellectual Property Office, the disclosure of which is incorporated herein in its entirety by reference.

BACKGROUND

1. Field

The present disclosure relates to an organic light emitting display apparatus and method of manufacturing the same.

2. Description of the Related Technology

An organic light emitting display apparatus uses a self-emission device that emits light when an electron and a hole combine in an organic layer when current flows in a fluorescent organic layer or a phosphorescent organic layer, which is inserted between two electrodes.

The organic light emitting display apparatus is self-emitting, and therefore has a wide viewing angle and high contrast. Also, an organic light emitting display apparatus does not require a backlight making it more lightweight and thin, and better power consumption.

An organic light emitting display apparatus generally includes a lower substrate whereon a display unit for realizing an image is formed, and an encapsulation substrate that is bonded to the lower substrate by using a sealing member.

In the display unit, a plurality of sub-pixels are formed at intersecting regions of a plurality of data lines and a plurality of gate lines. In an outer region of the display unit, a driving line unit for delivering a driving signal to the data lines and the gate lines, and a power line unit for delivering a power voltage are arranged.

If a short occurs when the lower substrate and the encapsulation substrate contact, the product appearance may deteriorate.

SUMMARY OF THE CERTAIN INVENTIVE ASPECTS

The present disclosure provides an organic light emitting display apparatus capable of preventing heat emission by instantly blocking a short occurring in its power line unit.

According to one aspect of the present invention, there is provided an organic light emitting display apparatus including a lower substrate including a display region whereon an image is displayed, and a non-display region outside the display region, the non-display region comprising a first power line for delivering a first power voltage and a second power line for delivering a second power voltage; an encapsulation substrate; and a functional layer including a thermoplastic resin formed between the power lines and the encapsulation substrate.

The functional layer may extend over regions corresponding to the first power line and the second power line.

The display region may include a thin film transistor (TFT) having an active layer; a gate electrode arranged on a gate insulating layer covering the active layer and extending to the non-display region; and source and drain electrodes arranged on an insulating interlayer covering the gate electrode and extending to the non-display region and that contact the active layer via contact holes formed in the gate insulating layer and the insulating interlayer, and the first power line and the second power line may be formed on the insulating interlayer in the non-display region with a predetermined distance therebetween.

The first power line and the second power line may be formed of a same material as a material for forming the source and drain electrodes.

The organic light emitting display apparatus may further include a planarization layer covering the source and drain electrodes and extending to the non-display region; a first conductive layer patterned for each of sub-pixels on the planarization layer of the display region, and arranged on the planarization layer of the non-display region, without being patterned; a pixel defining layer (PDL) covering the planarization layer and exposing a portion of the first conductive layer; and a second conductive layer arranged on the first conductive layer by having an organic layer formed therebetween in the display region, and contacting the first conductive layer in the non-display region.

A portion of the second power line may contact the portion of the first conductive layer.

The thermoplastic resin may have an insulation feature.

The thermoplastic resin may be a noncrystalline resin whose glass transition temperature is between about 10 to about 320° C.

The thermoplastic resin may be a crystalline resin whose melting temperature is between about 200 to about 900° C.

The thermoplastic resin may include one or more materials selected from the group consisting of polyethylene, poly vinyl chloride, polystyrene, polypropylene, poly methyl methacrylate, styrene-acrylonitril copolymer (SAN), and acrylonitrile-butadiene-styrene copolymer (ABS).

The functional layer may contact a bottom surface of the encapsulation substrate.

The functional layer may contact a top surface of a stacked layer covering the power lines.

The functional layer may simultaneously contact a bottom surface of the encapsulation substrate and a top surface of a stacked layer covering the power lines.

A thickness of the functional layer may be greater than a thickness of the first power line, and may be less than half of a thickness of the encapsulation substrate.

The organic light emitting display apparatus may further include a sealant surrounding the display region and the power lines, and bonding the lower substrate and the encapsulation substrate together.

The organic light emitting display apparatus may further include a polarizing plate on the encapsulation substrate.

According to another aspect, there is provided a method of manufacturing an organic light emitting display apparatus, the method including the operations of forming a lower substrate including a display region whereon an image is realized, and a non-display region that is an outer region of the display region, the non-display region including a first power line and a second power line; forming a functional layer including a thermoplastic resin on a top surface of a stacked layer covering the power lines; and bonding the lower substrate and an encapsulation substrate together.

According to another aspect, there is provided a method of manufacturing an organic light emitting display apparatus, the method including the operations of forming a lower substrate including a display region whereon an image is realized, and a non-display region outside the display region, wherein the non-display region includes a power lines; providing an encapsulation substrate, and forming a functional layer including a thermoplastic resin on a bottom surface of the encapsulation substrate; and bonding the lower substrate and an encapsulation substrate together.

BRIEF DESCRIPTION OF THE DRAWINGS

The above and other features and advantages will become more apparent by describing in detail exemplary embodiments with reference to the attached drawings in which.

DETAILED DESCRIPTION OF CERTAIN INVENTIVE EMBODIMENTS

Figure 1:
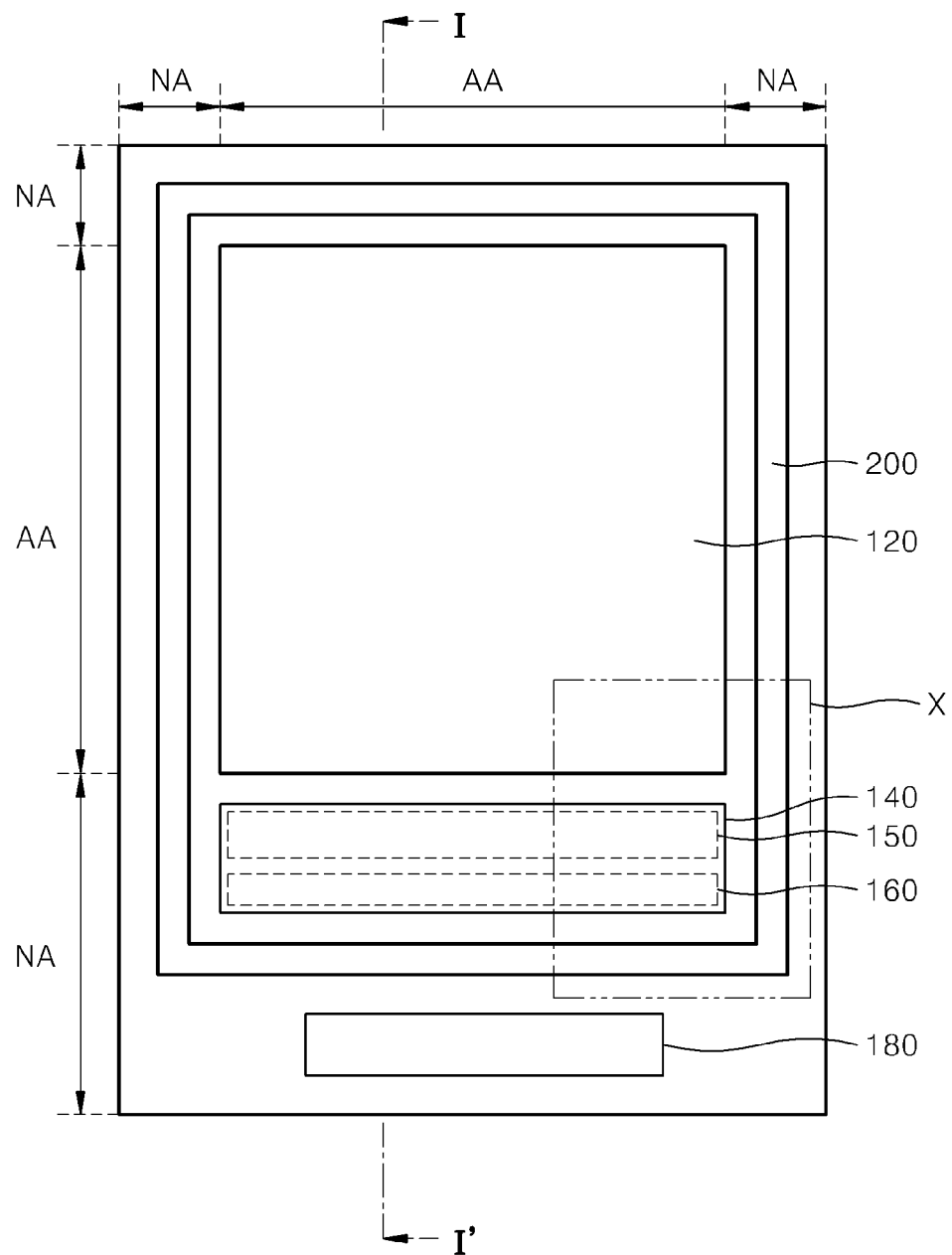
FIG. 1 is a plane view of an embodiment of an organic light emitting display apparatus.

Hereinafter, exemplary embodiments of the present invention will be described in detail with reference to the attached drawings. In the following description, well-known functions or constructions are not described in detail since they would obscure the disclosure with unnecessary detail. The present invention may, however, be embodied in many different forms, and should not be construed as being limited to the embodiments set forth herein.

In the drawings, the thicknesses of layers and regions are exaggerated for clarity. Like reference numerals generally denote like elements throughout the specification. Throughout the specification, it will also be understood that when an element such as layer, region, or substrate is referred to as being "on", or "above" another element, it can be directly on the other element, or intervening elements may also be present.

Figure 2A:
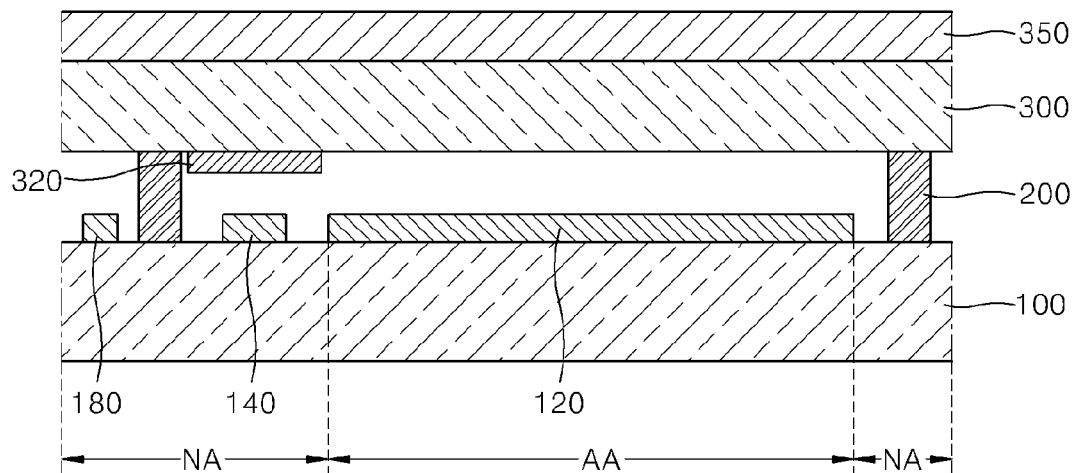
FIGS. 2A and 2B are cross-sectional views of the embodiment of an organic light emitting display apparatus of FIG. 1, taken along line I-I'.
Figure 2B:
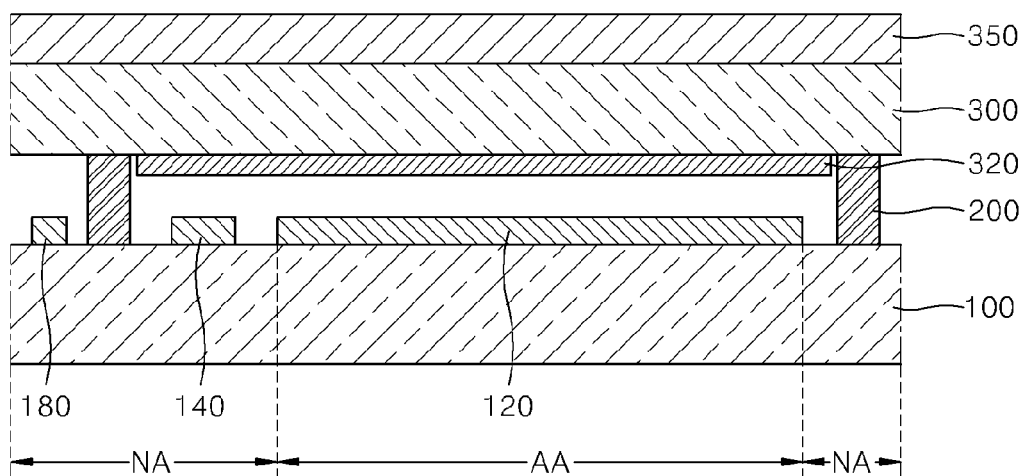
Figure 3:
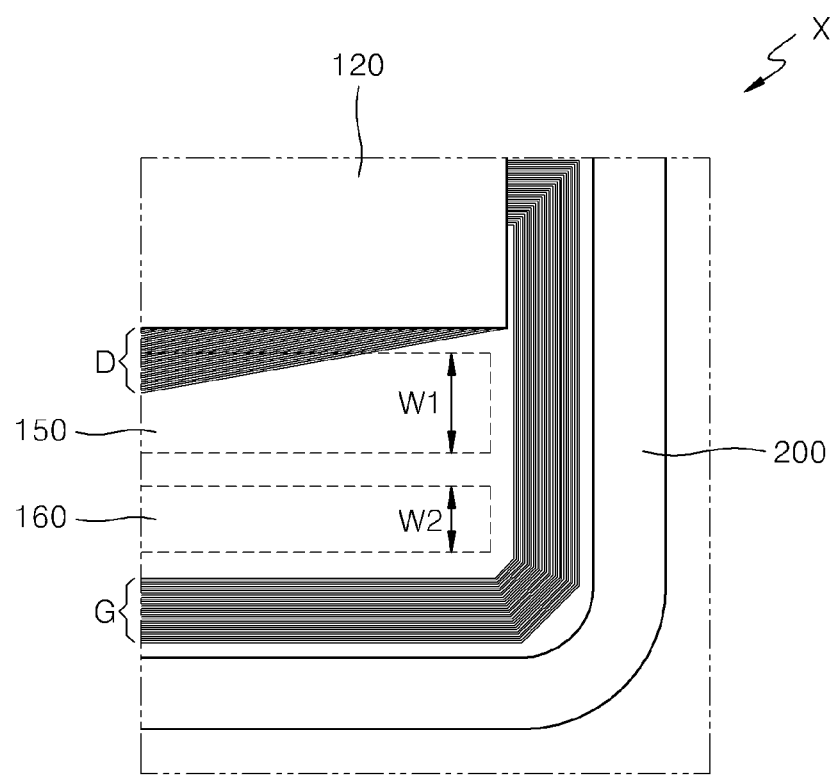
FIG. 3 is a magnified plane view of a region X in FIG. 1.

FIG. 1 is a plane view of an embodiment of an organic light emitting display apparatus. FIGS. 2A and 2B are cross-sectional views of the embodiment of an organic light emitting display apparatus of FIG. 1, taken along line I-I'. FIG. 3 is a magnified plane view of a region X in FIG. 1.

Referring to FIGS. 1 through 3, an embodiment of the organic light emitting display apparatus includes a lower substrate 100 having a power line 140 arranged in a non-display region that is outside of a display region whereon an image is displayed; an encapsulation substrate 300; and a functional layer 320 formed between the power line 140 and the encapsulation substrate 300.

The lower substrate 100 and the encapsulation substrate 300 are bonded by using a sealant 200, and a polarizing plate 350 may be arranged on the encapsulation substrate 300.

The lower substrate 100 is divided into a display region AA and a non-display region NA surrounding the display region AA.

The display region AA includes a display 120 that realizes an image.

In the display 120, pixels (not shown) are defined at points where a plurality of gate lines (not shown) and a plurality of data lines (not shown) cross each other, wherein the plurality of gate lines receive a scan signal in one direction, and the plurality of data lines receive a data signal while the plurality of data lines vertically cross the plurality of gate lines.

The non-display region NA that is outside of the display region AA includes the power line 140, a driver integrated circuit (IC) 180, and the sealant 200.

The power line 140 includes a first power line 150 and a second power line 160, wherein the first power line 150 delivers a first power voltage VDD to the display 120, and the second power line 160 delivers a second power voltage VSS to the display 120. In some embodiments, the first power voltage VDD may be higher than the second power voltage VSS. The first power line 150 and the second power line 160 are separated from each other by a predetermined distance. The first power line 150 has a width W1 and is adjacent to the display 120, and the second power line 160 has a width W2 and is adjacent to the sealant 200. In some embodiments, the width W1 of the first power line 150 may be greater than the width W2 of the second power line 160.

The driver IC 180 is arranged in an outer region of the sealant 200. The driver IC 180 is connected to a gate line G and a data line D which deliver a driving signal to the plurality of gate lines and the plurality of data lines respectively.

The sealant 200 surrounds the display unit 120 and power line 140, and is formed by irradiating heat or ultraviolet (UV) rays to a sealant and curing the sealant. The sealant may be formed of a UV-curable material or a thermocurable material, such as, for example, a silicon-based resin, an epoxy-based resin, an acryl-based resin, a polyimide-based resin, or the like. The encapsulation substrate 300 faces the lower substrate 100 and encapsulates the lower substrate 100. The functional layer 320 may be formed in a region between the encapsulation substrate 300 and the lower substrate 100 corresponding to the power line 140. In some embodiments, the functional layer 320 may be formed while contacting a top surface of a stacked layer covering the power line 140. In other embodiments, the functional layer 320 may be formed on a region corresponding to the first power line 150 and the second power line 160 while the functional layer 320 contacts a bottom surface of the encapsulation substrate 300. In yet other embodiments, the functional layer 320 is formed on both of the bottom surface of the encapsulation substrate 300 and the top surface of the stacked layer covering the power line 140.

The top surface of the stacked layer covering the power line 140 may be a top surface of a most outward layer from among layers covering the power line 140. In some embodiments, the top surface of the stacked layer may be a top surface of a pixel defining layer (PDL) (not shown) or a second conductive layer (not shown).

The polarizing plate 350 may be arranged on the encapsulation substrate 300, and functions to block reflection of an external light.

Particles may be formed in the organic light emitting display apparatus during the organic light emitting display apparatus manufacturing procedure. When the encapsulation substrate 300 presses the lower substrate 100, the particles may be pressed, and a short may occur between the first power line 150 and the second power line 160, and heat may be generated at a short point. When this heat is delivered to the encapsulation substrate 300, the polarizing plate 350 may be decolorized.

If the encapsulation substrate 300 presses the lower substrate 100, due to, for example, breakage of the organic light emitting display apparatus, a short may occur between the first power line 150 and the second power line 160, such that heat may be generated at a short point. When this heat is delivered to the encapsulation substrate 300, the polarizing plate 350 may be decolorized. The decolorization of the polarizing plate 350 may deteriorate a product appearance.

If a short occurs between the first power line 150 and the second power line 160 due to breakage of the lower substrate 100 or due to a pressing of the particles, the functional layer 320 may be melted into a breakage point, and that may prevent heat emission and additional defects.

A thermoplastic resin forming the functional layer 320 may have an insulation feature. With the insulation feature, a current in the short point may be cut.

The thermoplastic resin may be melted by heat incurred by the short. A temperature at the short point may instantly reach about 900° C., and a temperature of the encapsulation substrate 300 may reach about 100-300° C. during a short period of time. In a case where the polarizing plate 350 is stacked on the encapsulation substrate 300, the polarizing plate 350 is decolorized and deformed due to a high temperature. The thermoplastic resin of the functional layer 320 may be a noncrystalline resin whose glass transition temperature is between about 10 to about 320° C., or may be a crystalline resin whose melting temperature is between about 200 to about 900° C. If the thermal characteristic of the thermoplastic resin satisfies with this temperature range, the thermoplastic resin may be melted and may prevent heat emission and additional defects due to a short.

The functional layer 320 may be formed of one or more materials selected from the group consisting of polyethylene, poly vinyl chloride, polystyrene, polypropylene, poly methyl methacrylate, styrene-acrylonitril copolymer (SAN), and acrylonitrile-butadiene-styrene copolymer (ABS).

Figure 4:
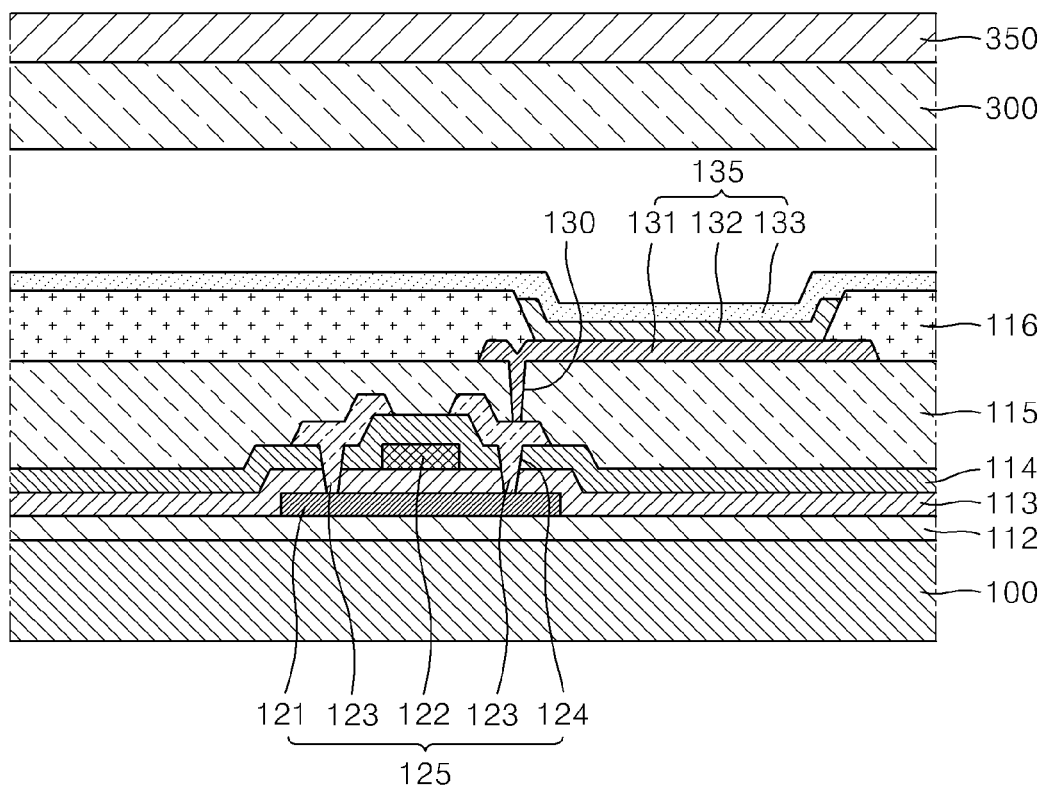
FIG. 4 is a magnified cross-sectional view of a portion of a display region of FIG. 2B.

FIG. 4 is a magnified cross-sectional view of a portion of the display region AA of FIG. 2B, and illustrates a detailed configuration of an embodiment of the display 120.

Referring to FIG. 4, a display 120 arranged on a lower substrate 100 may include a plurality of thin film transistors (TFT) 125 and a plurality of organic light emitting diodes (OLEDs) 135. However, for convenience of description, FIG. 4 illustrates one TFT 125 and one OLED 135.

In some embodiments, the lower substrate 100 may be formed of transparent glass containing $SiO_2$ as a main component. In other embodiments, the lower substrate 100 may be formed of one of various materials including a transparent plastic material, metal, and the like.

The plastic material forming the lower substrate 100 may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

In a bottom emission type organic light emitting display apparatus, in which an image is realized toward the lower substrate 100, the lower substrate 100 is formed of a transparent material. In a top emission type organic light emitting display apparatus, in which an image is realized away from the lower substrate 100, the lower substrate 100 may be formed of a transparent material, or the lower substrate 100 may be formed of metal. In embodiments where the lower substrate 100 is formed of metal, the lower substrate 100 may include at least one material selected from the group consisting of carbon, iron, chromium, manganese, nickel, titanium, molybdenum, stainless steel (SUS), Invar alloys, Inconel alloys, and Kovar alloys. In other embodiments, the lower substrate 100 may be formed of a metal foil.

An insulating layer 112 including a barrier layer or a buffer layer may be arranged on a top surface of the lower substrate 100 so as to prevent diffusion of impurity ion, to prevent penetration of moisture or air, and to polish the top surface of the lower substrate 100. The insulating layer 112 may be deposited by plasma enhanced chemical vapor deposition (PECVD), atmospheric pressure CVD (APCVD), low pressure CVD (LPCVD), or the like, by using SiO2 or SiNx.

The TFT 125, as a driving circuit, is arranged on the insulating layer 112. An active layer 121 of the TFT 125 is formed of a semiconductor material, and a gate insulating layer 113 is formed to cover the active layer 121. The active layer 121 may be formed of an inorganic semiconductor such as amorphous silicon or poly silicon, or it may be formed of an organic semiconductor. The active layer 121 may include a source region, a drain region, and a channel region between the source and drain regions.

The gate insulating layer 113 may be deposited by PECVD, APCVD, LPCVD, or the like, by using SiO2 or SiNx. The gate insulating layer 113 is completely formed on a top surface of the lower substrate 100 so as to include a display region AA and a non-display region NA.

A gate electrode 122 is arranged on the gate insulating layer 113, and an insulating interlayer 114 is formed to cover the gate electrode 122. The gate electrode 122 may be formed of one of various conductive materials including Al, Mo, W, Cr, Ni or a compound of any of these. If light has to pass through not only the active layer 121 of the TFT 125 but also other elements, the gate electrode 122 may be formed of one of various transparent conductive materials including ITO or IZO. When the gate electrode 122 is formed, a data wiring 170 (shown in FIG. 5A) may be simultaneously formed in the non-display region NA.

The insulating interlayer 114 may be formed of a material selected from the group consisting of polyimide, benzocyclobutene series resin, and acrylate, by using a spin coating method. The insulating interlayer 114 is completely formed on the top surface of the lower substrate 100 including the display region AA and the non-display region NA.

Source and drain electrodes 123 on the insulating interlayer 114 are connected to the active layer 121 via contact holes 124, and a planarization layer 115 is formed so as to cover the source and drain electrodes 123. The source and drain electrodes 123 may be formed of a material selected from the group consisting of Mg, Al, Ni, Cr, Mo, W, MoW, and Au. When the source and drain electrodes 123 are formed, a first power line 150 and a second power line 160 may be simultaneously formed in the non-display region NA by using the same material.

The planarization layer 115 is formed in the display region AA and the non-display region NA. In the non-display region NA, the planarization layer 115 completely covers the first power line 150 and partially covers the second power line 160. The planarization layer 115 may be formed by using an inorganic insulating layer or an organic insulating layer, wherein the inorganic insulating layer may include $SiO_2$, SiNx, SiON, $Al_2O_3$, $TiO_2$, $Ta_2O_5$, $HfO_2$, $ZrO_2$, BST or PZT, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof. In other embodiments, the planarization layer 115 may be formed as a multi-stack including an inorganic insulating layer and an organic insulating layer.

The structure of the TFT 125 is not limited to the aforementioned structure, and may vary. In one embodiment, the TFT 125 is a top gate type TFT, but may be a different type in other embodiments.

A first electrode 131 (pixel electrode) of the OLED 135 is formed on the planarization layer 115, and is electrically connected to the source and drain electrodes 123 via a via hole 130. The via hole 130 may be formed by etching the planarization layer 115 and then exposing a portion of the source and drain electrodes 123.

A first conductive layer is deposited on the planarization layer 115 in the display region AA and the non-display region NA, and then is patterned for each of sub-pixels in the display region AA, so that the first electrode 131 is formed in the display region AA, and the first conductive layer is not patterned and remains in the non-display region NA.

The first electrode 131 may be formed as a transparent electrode or a reflective electrode. in embodiments where the first electrode 131 is formed as a transparent electrode, the first electrode 131 may include a transparent layer formed of ITO, IZO, ZnO or $In_2O_3$. In embodiments where the first electrode 131 is formed as a reflective electrode, the first electrode 131 may include a reflective layer formed of Ag, Mg, Al, Pt, Pd, Au, Ni, Nd, Ir, Cr or compound of any of these, and a transparent layer formed of ITO, IZO, ZnO or $In_2O_3$.

A pixel defining layer (PDL) 116 is arranged on the planarization layer 115. A pattern of the PDL 116 may be formed by exposing a portion of the first electrode 131 by depositing an insulating layer on the planarization layer 115 and patterning the insulating layer. The patterning of the PDL 116 is performed for each of sub-pixels in the display region AA toward a region of the first power line 150 in the non-display region NA.

The PDL 116 may be formed of one or more organic insulating materials selected from the group consisting of polyimide, polyamide, acryl resin, benzocyclobutene and phenol resin, by using a spin coating method. The PDL 116 may also include an inorganic insulating material selected from the group consisting of $SiO_2$, SiNx, $Al_2O_3$, CuOx, $Tb_4O_7$, $Y_2O_3$, $Nb_2O_5$, and $Pr_2O_3$. In some embodiments, the PDL 116 may have a multi-stack structure in which the organic insulating material alternates with the inorganic insulating material.

A second electrode 133 is arranged on the first electrode 131 and faces the first electrode 131. A second conductive layer is formed on the PDL 116, extending over the display region AA and a portion of the non-display region NA. The second conductive layer functions as the second electrode 133 that faces the first electrode 131 by having an organic layer 132 arranged therebetween. The second electrode 133 extends over all sub-pixels.

The second electrode 133 may be formed as a transparent electrode or a reflective electrode. In embodiments where the second electrode 133 is formed as a transparent electrode, the second electrode 133 may include a layer formed by depositing Li, Ca, LiF/Ca, LiF/Al, Al, Mg or compound of any of these so as to face the organic layer 132, and may include an auxiliary electrode or a bus electrode, which is formed on the layer by using a transparent conductive material including ITO, IZO, ZnO or $In_2O_3$. In embodiments where the second electrode 133 is formed as the reflective electrode, the second electrode 133 may be formed of Ag, Mg, Al, Pt, Pd, Au, Ni, Nd, Ir, Cr, Li, Ca, LiF/Ca, LiF/Al or compound of any of these.

The organic layer 132 is interposed between the first electrode 131 and the second electrode 133.

The organic layer 132 may be formed as a small-molecular organic layer or a polymer organic layer. In embodiments where the organic layer 132 is formed as a small-molecular organic layer, the organic layer 132 may have a single or multi-layered structure in which a hole injection layer (HIL), a hole transport layer (HTL), an organic emission layer (EML), an electron transport layer (ETL), and an electron injection layer (EIL) are stacked. An organic material that may be used as the small-molecular organic layer includes copper phthalocyanine (CuPc), N,N'-Di(naphthalene-1-yl)-N,N'-diphenyl-benzidine (NPB), tris-8-hydroxyquinoline aluminum) ($Alq_3$), and the like. The small-molecular organic layer may be formed by using masks according to a vacuum deposition method.

In embodiments where the organic layer 132 is formed as a polymer organic layer, the organic layer 132 may have a structure in which an HTL and an EML are arranged. The HTL may be formed of poly-(2,4)-ethylene-dihydroxy thiophene (PEDOT), and the EML may be formed of a polymer organic material including a Poly-Phenylenevinylene (PPV) based material, a polyfluorene-based material, or the like.

The encapsulation substrate 300 in the display region AA does not include the functional layer 320.

A polarizing plate 350 may be arranged on the encapsulation substrate 300. The polarizing plate 350 is arranged on a path of light emitted from the display unit 120.

Figure 5A:
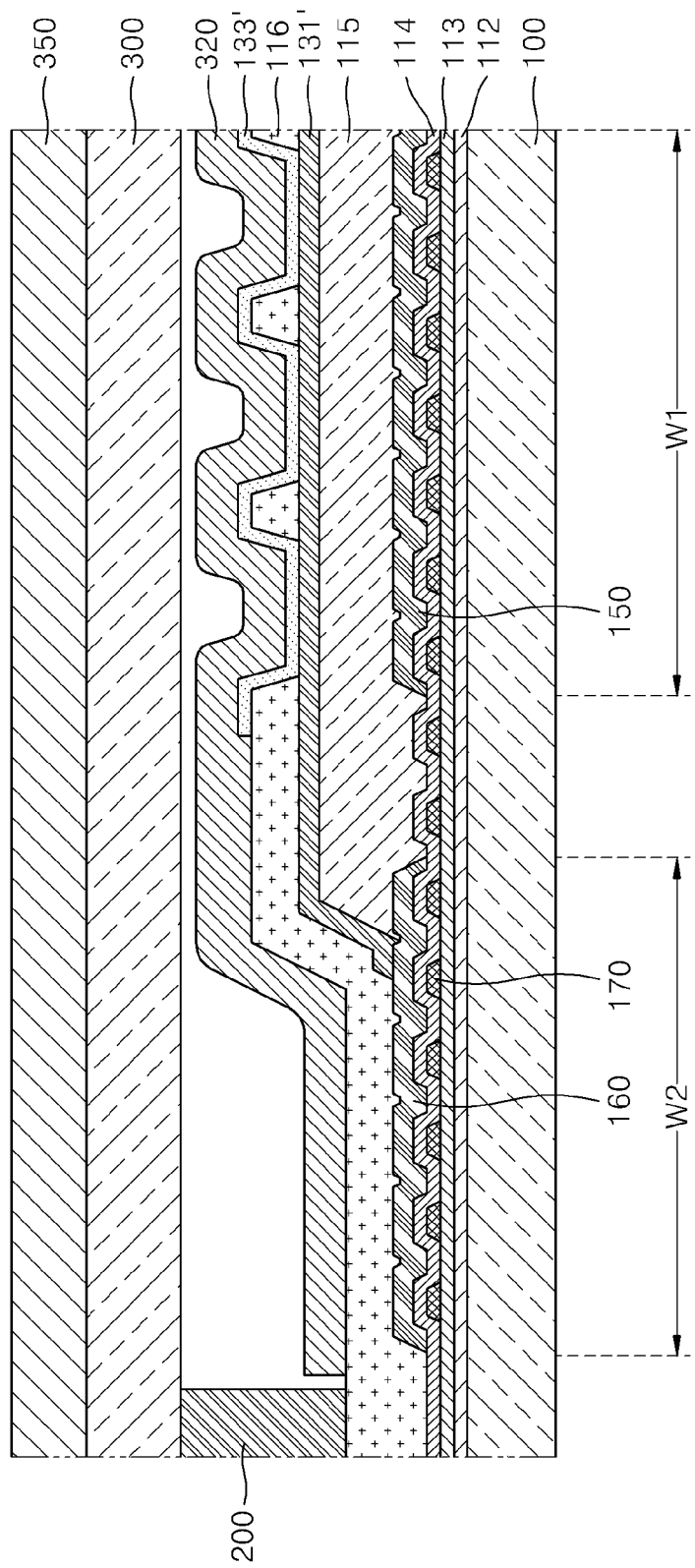
FIGS. 5A and 5B are magnified cross-sectional views of a portion of a non-display region of FIG. 2B.
Figure 5B:
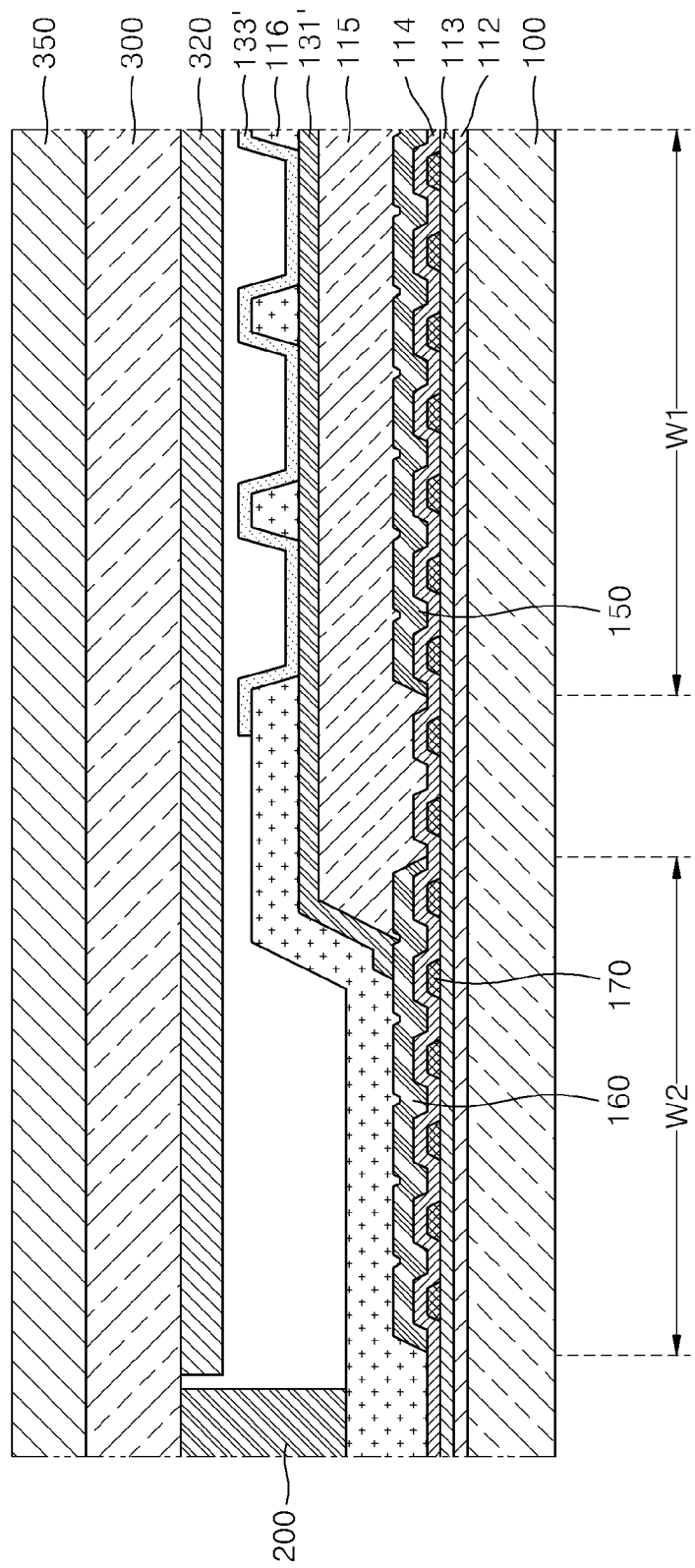

FIGS. 5A and 5B are magnified cross-sectional views of a portion of the non-display region NA of FIG. 2B. Hereinafter, the detailed descriptions regarding the same elements as those described in relation to FIG. 4 are omitted.

Referring to FIGS. 5A and 5B, a first power line 150 and a second power line 160 are formed in the non-display region NA of a lower substrate 100. A functional layer 320 is formed between the lower substrate 100 and an encapsulation substrate 300.

An insulating layer 112 including a barrier layer or a buffer layer is arranged on the lower substrate 100.

A gate insulating layer 113 is arranged on the insulating layer 112. The gate insulating layer 113 is completely formed on a top surface of the lower substrate 100 so as to include a display region AA and the non-display region NA.

A data wiring 170 that is connected to a plurality of data lines is formed on the gate insulating layer 113. The data wiring 170 may be simultaneously formed with a gate electrode 122 in the display region AA. The data wiring 170 may be formed of the same material as the gate electrode 122. In some embodiments, the data wiring 170 may be formed of one of various conductive materials including Al, Mo, W, Cr, Ni or compound of any of these. The data wiring 170 extends to a driver IC 180 in an outer region of a sealant 200.

An insulating interlayer 114 is formed on the data wiring 170. The insulating interlayer 114 is completely formed on the top surface of the lower substrate 100 so as to include the display region AA and the non-display region NA.

The first power line 150 and the second power line 160 are formed on the insulating interlayer 114. Source and drain electrodes 123 may be arranged on the same layer as the first power line 150 and the second power line 160 in the display region AA.

The first power line 150 is closer to the display 120 than the second power line 160. The first power line 150 has a width W1. The first power line 150 is connected to a source electrode or a drain electrode of a TFT, and delivers a first power voltage VDD to the source electrode or the drain electrode. The first power line 150 may be formed of the same material as the source and drain electrodes 123. In some embodiments, the first power line 150 may be formed of a material selected from the group consisting of Mg, Al, Ni, Cr, Mo, W, MoW, and Au.

The second power line 160 is separated from the first power line 150 by a predetermined distance, and is adjacent to the sealant 200. The second power line 160 has a width W2 that may be less than the width W1 of the first power line 150 in some embodiments. A portion of the second power line 160 contacts a portion of a first conductive layer 131'. A portion of the first conductive layer 131' contacts a second conductive layer 133'. The second power line 160 is electrically connected to the second conductive layer 133', and thus may deliver a second power voltage VSS to the second conductive layer 133'. The second power line 160 may be formed of the same material as the source and drain electrodes 123. In some embodiments, the second power line 160 may be formed of a material selected from the group consisting of Mg, Al, Ni, Cr, Mo, W, MoW, and Au.

A planarization layer 115 is formed on the lower substrate 100 including the first power line 150. The planarization layer 115 may completely cover the first power line 150 and partially cover the second power line 160.

The first conductive layer 131' is arranged on the planarization layer 115. After the first conductive layer 131' is deposited on the lower substrate 100, the first conductive layer 131' is patterned to a first electrode 131 in the display region AA, and remains in the non-display region NA without being patterned. The first conductive layer 131' may be formed of ITO, IZO, ZnO or $In_2O_3$. The first conductive layer 131' may include a reflective layer formed of Ag, Mg, Al, Pt, Pd, Au, Ni, Nd, Ir, Cr or compound of any of these, or may include a transparent layer formed of ITO, IZO, ZnO or $In_2O_3$.

A PDL 116 is arranged on the first conductive layer 131' formed on the lower substrate 100. The PDL 116 is formed by patterning an insulating layer deposited on a corresponding region of the lower substrate 100. The PDL 116 exposes a portion of the first electrode 131 for each of sub-pixels in the display region AA. The PDL 116 exposes a portion of the first conductive layer 131' by the predetermined distance in the non-display region NA.

A second conductive layer 133' is arranged so as to cover the PDL 116 and the exposed first conductive layer 131'. The second conductive layer 133' functions as a second electrode 133 that extends over all sub-pixels in the display region AA. The second conductive layer 133' contacts the first conductive layer 131' exposed by the PDL 116. The second conductive layer 133' may be formed by thinly depositing Ag, Mg, Al, Pt, Pd, Au, Ni, Nd, Ir, Cr, Li, Ca, LiF/Ca, LiF/Al or compound of any of these. The second conductive layer 133' may include a layer formed of Li, Ca, LiF/Ca, LiF/Al, Al, Mg or compound of any of these, and another layer that is formed of a transparent conductive material including ITO, IZO, ZnO or $In_2O_3$ and that is formed on the layer.

The second conductive layer 133' may be electrically connected to the second power line 160 by contacting the first conductive layer 131' in the non-display region NA.

The lower substrate 100 is bonded with the encapsulation substrate 300. In various embodiments, the encapsulation substrate 300 may be a glass substrate, a plastic substrate formed of one of various plastic materials including acryl, or a metal substrate. The encapsulation substrate 300 includes the functional layer 320 so as to correspond to the first power line 150 and the second power line 160. A polarizing plate 350 may be arranged on the encapsulation substrate 300.

Embodiments of the organic light emitting display apparatus may be manufactured in a manner that a lower substrate 100 is formed, wherein the lower substrate 100 is divided into a display region whereon an image is realized, and a non-display region that is an outer region of the display region and that includes a power line 140 having a first power line 150 and a second power line 160; a functional layer 320 including a thermoplastic resin is formed on a stacked layer covering the power line 140; and then the lower substrate 100 and an encapsulation substrate 300 are bonded together (see FIG. 5A). The organic light emitting display apparatus may also be manufactured in a manner that a lower substrate 100 is formed, wherein the lower substrate 100 is divided into a display region whereon an image is realized, and a non-display region that is an outer region of the display region and that includes a power line 140; a functional layer 320 including a thermoplastic resin is formed on a bottom surface of an encapsulation substrate 300; and then the lower substrate 100 and the encapsulation substrate 300 are bonded together (see FIG. 5B).

Figure 6:
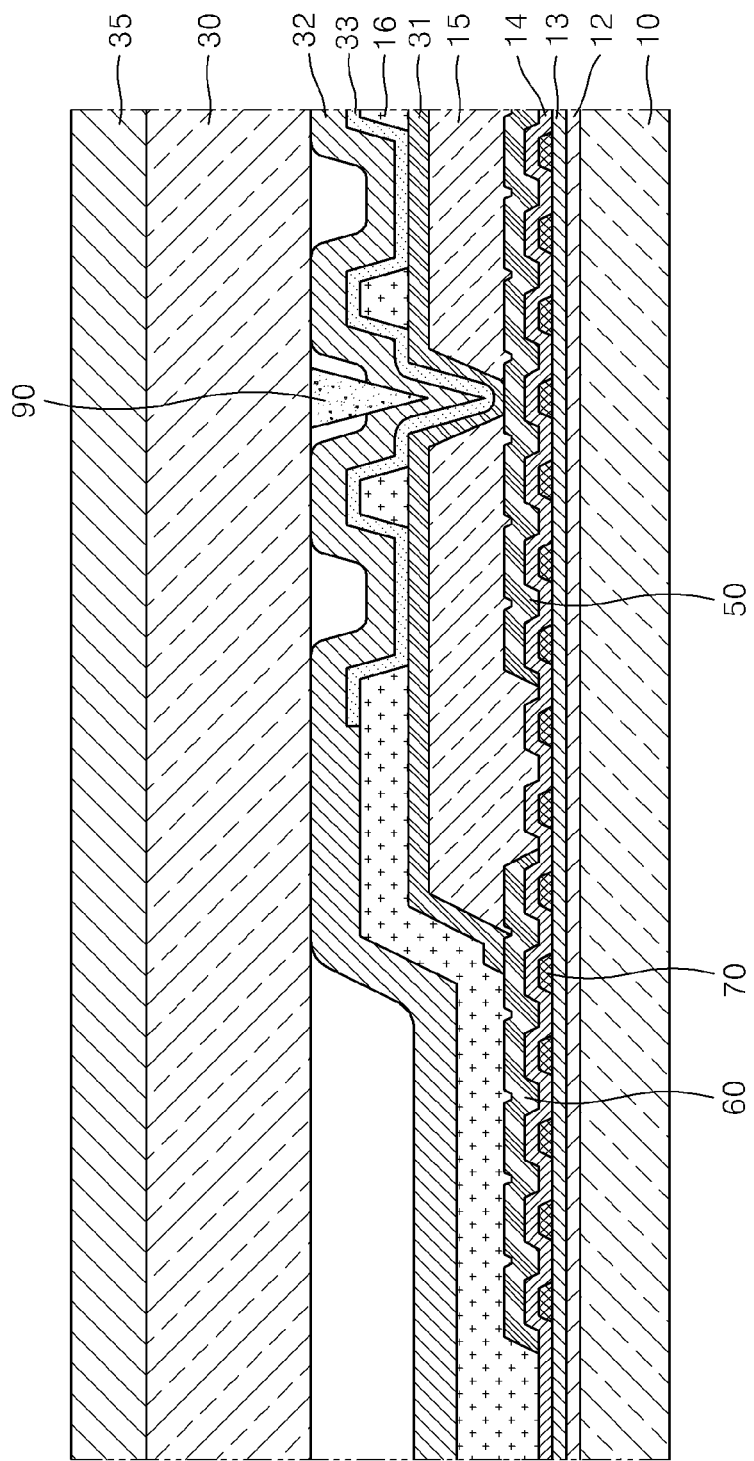
FIG. 6 is a cross-sectional view of an embodiment of a pressed organic light emitting display apparatus.

FIG. 6 is a cross-sectional view of an embodiment of a pressed organic light emitting display apparatus including an encapsulation substrate 30.

Referring to FIG. 6, a particle 90 may be formed in the organic light emitting display apparatus during an organic light emitting display apparatus manufacturing procedure.

In a normal situation, a short does not occur in a first power line 50 and a second power line 60, regardless of a size of the particle 90.

In a case where the size of the particle 90 is large, e.g., when the size of the particle 90 is greater than a height between the first power line 50 and a second conductive layer 33, the second conductive layer 33 and a first conductive layer 31 contacting the second conductive layer 33 contact the first power line 50 due to the encapsulation substrate 30 being pressed. Since the first conductive layer 31 contacts the second power line 60, a short occurs between the first power line 50 and the second power line 60. Due to this short, heat is generated in a short point, and when the heat is delivered to the encapsulation substrate 30, a polarizing plate 35 may be decolorized. The decolorization of the polarizing plate 35 may deteriorate a product appearance.

Although not illustrated in FIG. 6, a short may occur between the first power line 50 and the second power line 60 when the encapsulation substrate 30 presses a lower substrate 10 due to breakage of the organic light emitting display apparatus.

Referring back to FIG. 5, when the encapsulation substrate 30 presses the lower substrate 10 due to breakage of the organic light emitting display apparatus or a particle, the short occurs between the first power line 50 and the second power line 60, such that heat is generated and the lower substrate 10 is broken. A functional layer 32 that is formed in a region corresponding to a power line 14 is melted into a breakage point, reaches the short point, and then prevents heat emission by the short, so that an additional defect such as the decolorization of the polarizing plate 35 is prevented.

The functional layer 32 may correspond to a width W1 of the first power line 50 and a width W2 of the second power line 60. A height (thickness; H) of the functional layer 32 may be between a height of the first power line 50 and a half (d/2) of a height of the encapsulation substrate 30. Here, d indicates the height of the encapsulation substrate 30. The height of the functional layer 32 is equal to or greater than the height of the first power line 50 so as to surround the first power line 50, and if the height of functional layer 32 is greater than a value of d/2, it is disadvantageous in rigidity. By arranging the functional layer 32, it is possible to prevent a short occurring between power lines due to a particle having a size greater than a height between the first power line 50 and the second conductive layer 33.

The lower substrate 10 and the encapsulation substrate 30 are bonded by using the sealant 200. A glass frit may be used as the sealant 200.

The aforementioned embodiment is described with reference to a case of an active matrix (AM) organic light emitting display apparatus. However, the aforementioned embodiment may also be applied to a passive matrix (PM) organic light emitting display apparatus, a liquid crystal display (LCD) apparatus, or the like.

The organic light emitting display apparatus may prevent a short between power lines in a non-display region, so that it is possible to prevent deterioration of a product appearance, and decolorization of a polarizing plate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
a lower substrate comprising a display region whereon an image is displayed, and a non-display region outside the display region, the non-display region comprising a first power line for delivering a first power voltage and a second power line for delivering a second power voltage;
wherein the display region comprises:
a thin film transistor (TFT) having an active layer;
a gate electrode arranged on a gate insulating layer covering the active layer and extending to the non-display region; and
source and drain electrodes arranged on an insulating interlayer covering the gate electrode and extending to the non-display region and that contact the active layer via contact holes formed in the gate insulating layer and the insulating interlayer,
wherein the first power line and the second power line are formed on the insulating interlayer in the non-display region with a predetermined distance therebetween;
an encapsulation substrate;
a functional layer comprising a thermoplastic resin formed between the power lines and the encapsulation substrate, wherein the functional layer extends over regions corresponding to the first power line and the second power line;
a polarizing plate on the encapsulation substrate;
a planarization layer covering the source and drain electrodes and extending to the non-display region;
a first conductive layer patterned for each of sub-pixels on the planarization layer of the display region, and arranged on the planarization layer of the non-display region, without being patterned;
a pixel defining layer (PDL) covering the planarization layer and exposing a portion of the first conductive layer; and
a second conductive layer arranged on the first conductive layer by having an organic layer formed therebetween in the display region, and contacting the first conductive layer in the non-display region.

2. The organic light emitting display apparatus of claim 1, wherein a portion of the second power line contacts the portion of the first conductive layer.

3. A method of manufacturing an organic light emitting display apparatus, the method comprising:
forming a lower substrate comprising a display region whereon an image is realized, and a non-display region that is an outer region of the display region, the non-display region comprising a first power line and a second power line;
forming a functional layer comprising a thermoplastic resin on a top surface of a stacked layer covering the power lines, wherein the functional layer extends over regions corresponding to the first power line and the second power line;
bonding the lower substrate and an encapsulation substrate together; and
forming a polarizing plate on the encapsulation substrate;
wherein the display region comprises
a thin film transistor (TFT) having an active layer;
a gate electrode arranged on a gate insulating layer covering the active layer and extending to the non-display region; and
source and drain electrodes arranged on an insulating interlayer covering the gate electrode and extending to the non-display region and that contact the active layer via contact holes formed in the gate insulating layer and the insulating interlayer;
a planarization layer covering the source and drain electrodes and extending to the non-display region;
a first conductive layer patterned for each of sub-pixels on the planarization layer of the display region, and arranged on the planarization layer of the non-display region, without being patterned;
a pixel defining layer (PDL) covering the planarization layer and exposing a portion of the first conductive layer; and
a second conductive layer arranged on the first conductive layer by having an organic layer formed therebetween in the display region, and contacting the first conductive layer in the non-display region.

4. An organic light emitting display apparatus comprising:
a lower substrate comprising a display region whereon an image is displayed, and a non-display region outside the display region, the non-display region comprising a first power line for delivering a first power voltage and a second power line for delivering a second power voltage,
wherein the display region comprises:
a thin film transistor (TFT) having an active layer,
a gate electrode arranged on a gate insulating layer covering the active layer and extending to the non-display region, and
source and drain electrodes arranged on an insulating interlayer covering the gate electrode and extending to the non-display region and that contact the active layer via contact holes formed in the gate insulating layer and the insulating interlayer,
wherein the first power line and the second power line are formed on the insulating interlayer in the non-display region with a predetermined distance therebetween;
an encapsulation substrate;
a functional layer comprising a thermoplastic resin formed between the power lines and the encapsulation substrate;
a planarization layer covering the source and drain electrodes and extending to the non-display region;
a first conductive layer patterned for each of sub-pixels on the planarization layer of the display region, and arranged on the planarization layer of the non-display region, without being patterned;
a pixel defining layer (PDL) covering the planarization layer and exposing a portion of the first conductive layer; and
a second conductive layer arranged on the first conductive layer by having an organic layer formed therebetween in the display region, and contacting the first conductive layer in the non-display region.

5. The organic light emitting display apparatus of claim 4, wherein the first power line and the second power line are formed of a same material as a material for forming the source and drain electrodes.

6. The organic light emitting display apparatus of claim 4, wherein the thermoplastic resin has an insulation feature.

7. The organic light emitting display apparatus of claim 4, wherein the thermoplastic resin is a noncrystalline resin whose glass transition temperature is between about 10 to about 320° C.

8. The organic light emitting display apparatus of claim 4, wherein the thermoplastic resin is a crystalline resin whose melting temperature is between about 200 to about 900° C.

9. The organic light emitting display apparatus of claim 4, wherein the thermoplastic resin comprises one or more materials selected from the group consisting of polyethylene, poly vinyl chloride, polystyrene, polypropylene, poly methyl methacrylate, styrene-acrylonitril copolymer (SAN), and acrylonitrile-butadiene-styrene copolymer (ABS).

10. The organic light emitting display apparatus of claim 4, wherein the functional layer contacts a bottom surface of the encapsulation substrate.

11. The organic light emitting display apparatus of claim 4, wherein the functional layer contacts a top surface of a stacked layer covering the power lines.

12. The organic light emitting display apparatus of claim 4, wherein the functional layer simultaneously contacts a bottom surface of the encapsulation substrate and a top surface of a stacked layer covering the power lines.

13. The organic light emitting display apparatus of claim 4, wherein a thickness of the functional layer is greater than a thickness of the first power line, and is less than half of a thickness of the encapsulation substrate.

14. The organic light emitting display apparatus of claim 4, further comprising a sealant surrounding the display region and the power lines, and bonding the lower substrate and the encapsulation substrate together.

15. The organic light emitting display apparatus of claim 4, wherein a portion of the second power line contacts the portion of the first conductive layer.

* * * * *

UNITED STATES PATENT AND TRADEMARK OFFICE
CERTIFICATE OF CORRECTION

PATENT NO. : 8,766,323 B2  
APPLICATION NO. : 13/207225  
DATED : July 1, 2014  
INVENTOR(S) : Eun-Ah Kim et al.

Page 1 of 1

It is certified that error appears in the above-identified patent and that said Letters Patent is hereby corrected as shown below:

On the Title Page, Item (56) column 1, line 14 please delete "Transistion" and insert -- Transition --, therefor.

Signed and Sealed this
Fourteenth Day of April, 2015

Michelle K. Lee
*Director of the United States Patent and Trademark Office*